(12) United States Patent
Choi et al.

(10) Patent No.: US 10,908,503 B2
(45) Date of Patent: Feb. 2, 2021

(54) APPARATUS FOR TREATING SUBSTRATE

(71) Applicant: SEMES CO., LTD., Chungcheongnam-do (KR)

(72) Inventors: Kihoon Choi, Cheonan-si (KR); Chan Young Heo, Hwaseong-si (KR); Do Heon Kim, Cheonan-si (KR); Hae-Won Choi, Daejeon (KR); Jaeseong Lee, Hwaseong-si (KR); Anton Koriakin, Cheonan-si (KR); Ji Soo Jeong, Seoul (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 16/565,661

(22) Filed: Sep. 10, 2019

(65) Prior Publication Data
US 2020/0081347 A1 Mar. 12, 2020

(30) Foreign Application Priority Data
Sep. 12, 2018 (KR) ........................ 10-2018-0108733

(51) Int. Cl.
| G03D 3/00 | (2006.01) |
| G03F 7/16 | (2006.01) |
| B08B 3/04 | (2006.01) |
| G03F 7/32 | (2006.01) |
| G03F 7/30 | (2006.01) |

(52) U.S. Cl.
CPC ............... *G03F 7/168* (2013.01); *B08B 3/04* (2013.01); *G03F 7/3057* (2013.01); *G03F 7/32* (2013.01)

(58) Field of Classification Search
USPC ................................. 396/564, 611
See application file for complete search history.

(56) References Cited

U.S. PATENT DOCUMENTS

| 6,736,149 | B2 * | 5/2004 | Biberger | ........... H01L 21/67167 |
| | | | | 134/102.2 |
| 7,665,917 | B2 * | 2/2010 | Head | ........................ G03F 7/168 |
| | | | | 118/733 |
| 2002/0160625 | A1 | 10/2002 | Inoue et al. | |
| 2002/0170671 | A1 * | 11/2002 | Matsushita | ............. C23C 16/54 |
| | | | | 156/345.31 |
| 2003/0019578 | A1 | 1/2003 | Iwata et al. | |
| 2003/0121535 | A1 * | 7/2003 | Biberger | ........... H01L 21/67167 |
| | | | | 134/25.4 |

(Continued)

FOREIGN PATENT DOCUMENTS

| JP | 2002329650 A | 11/2002 |
| JP | 2003045770 A | 2/2003 |

(Continued)

OTHER PUBLICATIONS

Korean Patent Office, Office action dated Jan. 14, 2020.

*Primary Examiner* — Rodney E Fuller
(74) *Attorney, Agent, or Firm* — Li & Cai Intellectual Property (USA) Office

(57) ABSTRACT

An apparatus for treating a substrate includes a developing chamber that performs a developing process on the substrate by supplying a developing solution, a supercritical chamber that treats the substrate by supplying a supercritical fluid, and a transfer chamber having a transfer unit that transfers the substrate W between the developing chamber and the supercritical chamber.

11 Claims, 9 Drawing Sheets

(56) References Cited

U.S. PATENT DOCUMENTS

| | | | | |
|---|---|---|---|---|
| 2003/0136514 A1* | 7/2003 | Biberger | ............ | H01L 21/67167 |
| | | | | 156/345.31 |
| 2003/0202792 A1* | 10/2003 | Goshi | ............... | H01L 21/68728 |
| | | | | 396/564 |
| 2004/0180299 A1* | 9/2004 | Rolland | ................ | G03F 7/2041 |
| | | | | 430/322 |
| 2006/0207971 A1* | 9/2006 | Moriya | ..................... | C23F 1/12 |
| | | | | 216/67 |
| 2007/0242248 A1* | 10/2007 | Nakano | ................... | G03F 7/168 |
| | | | | 355/53 |

FOREIGN PATENT DOCUMENTS

| | | | |
|---|---|---|---|
| JP | 2003092244 A | 3/2003 | |
| JP | 2003347186 A | 12/2003 | |
| JP | 2006024638 A | 1/2006 | |
| JP | 2006269672 A | 10/2006 | |
| KR | 10-0434191 B | 5/2004 | |
| KR | 10-0488376 B | 4/2005 | |
| KR | 10-0744888 B | 7/2007 | |
| KR | 10-1692679 B | 12/2016 | |
| KR | 10-20170136786 A | 12/2017 | |
| KR | 10-2018-0043438 A | 4/2018 | |
| KR | 10-2019-0000951 A | 1/2019 | |

* cited by examiner

APPARATUS FOR TREATING SUBSTRATE

CROSS-REFERENCE TO RELATED APPLICATIONS

A claim for priority under 35 U.S.C. § 119 is made to Korean Patent Application No. 10-2018-0108733 filed on Sep. 12, 2018, in the Korean Intellectual Property Office, the entire contents of which are hereby incorporated by reference.

BACKGROUND

Embodiments of the inventive concept described herein relate to a substrate treating apparatus, and more particularly, relate to a substrate treating apparatus for performing a developing process and a supercritical process.

Various processes, such as deposition, photolithography, etching, cleaning, and the like, are performed to manufacture semiconductor devices. Among these processes, the photolithography process includes a coating process, an exposing process, and a developing process. The coating process is a process of coating a substrate with a light-sensitive material such as photoresist. The exposing process is a process of exposing the coated photoresist film to light of a light source through a photo mask to form a circuit pattern on the substrate. The developing process is a process of selectively developing the exposed region of the substrate.

In general, the developing process includes a developing solution supply step, a rinsing solution supply step, and a drying step. In the drying step, a spin dry method of rotating a spin chuck that supports a substrate and drying a developing solution or a rinsing solution remaining on the substrate by using a centrifugal force exerted on the substrate by the spin chuck is performed.

With a reduction in critical dimension (CD) of patterns formed on a substrate, the spin dry method in the related art causes a leaning phenomenon in which the patterns collapse or bend. This problem is pointed out as a limitation of existing equipment that performs a photolithography process.

SUMMARY

Embodiments of the inventive concept provide an apparatus for efficiently performing a developing process.

Embodiments of the inventive concept provide an apparatus for preventing a substrate from being dried when transferred from a developing chamber to a supercritical chamber.

Embodiments of the inventive concept provide an apparatus for preventing a leaning phenomenon in which patterns collapse or bend.

Embodiments of the inventive concept provide a platform of a substrate treating apparatus for efficiently performing a coating process, a developing process, and a supercritical process.

Embodiments of the inventive concept provide an apparatus for minimizing tact time taken to transfer a substrate.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for treating a substrate includes a developing chamber that performs a developing process on the substrate by supplying a developing solution, a supercritical chamber that treats the substrate by supplying a supercritical fluid, and a transfer chamber having a transfer unit that transfers the substrate between the developing chamber and the supercritical chamber.

According to an embodiment, the apparatus may further include a controller that controls the transfer unit, and the controller may control the transfer unit to transfer the substrate having the developing solution remaining thereon from the developing chamber to the supercritical chamber.

According to an embodiment, the developing chamber may include a developing nozzle that supplies the developing solution and a cleaning nozzle that supplies a cleaning solution, and the apparatus may further include a controller that controls the transfer unit. The controller may control the transfer unit to transfer the substrate having the developing solution or the cleaning solution remaining thereon from the developing chamber to the supercritical chamber.

According to an embodiment, the apparatus may further include a heat treatment chamber that performs a heat treatment process on the substrate.

According to an exemplary embodiment, an apparatus for treating a substrate includes an index module including a carrier in which the substrate is received, a treating module that performs a process on the substrate, and an interface module that connects the treating module with an external stepper. The index module, the treating module, and the interface module are sequentially arranged in a row. The treating module includes a treating block that performs the process on the substrate. The treating block includes a developing chamber that performs a developing process on the substrate by supplying a developing solution, a coating chamber that forms a coating film on the substrate by supplying a coating solution, a heat treatment chamber that performs a heat treatment process on the substrate, a supercritical chamber that treats the substrate by supplying a supercritical fluid, and a transfer chamber having a transfer unit that transfers the substrate between the developing chamber, the coating chamber, the heat treatment chamber, and the supercritical chamber.

According to an embodiment, the apparatus may further include a controller that controls the transfer unit, and the controller may control the transfer unit to transfer the substrate having the developing solution remaining thereon from the developing chamber to the supercritical chamber.

According to an embodiment, the developing chamber may include a developing nozzle that supplies the developing solution and a cleaning nozzle that supplies a cleaning solution, and the apparatus may further include a controller that controls the transfer unit. The controller may control the transfer unit to transfer the substrate having the developing solution or the cleaning solution remaining thereon from the developing chamber to the supercritical chamber.

According to an embodiment, the coating chamber and the developing chamber may be vertically stacked on each other. A dimension of the supercritical chamber in a vertical direction may be larger than a dimension of the coating chamber or the developing chamber in the vertical direction and may be equal to or smaller than the sum of dimensions of the coating chamber and the developing chamber in the vertical direction.

According to an embodiment, the coating chamber and the developing chamber may be disposed on one side of the transfer chamber, and the heat treatment chamber may be disposed on an opposite side of the transfer chamber.

According to an embodiment, the supercritical chamber may be disposed on the one side and the opposite side of the transfer chamber.

According to an embodiment, the treating block may include a plurality of treating blocks vertically stacked one above another.

According to an exemplary embodiment, an apparatus for treating a substrate includes an index module including a carrier in which the substrate is received, a treating module that performs a process on the substrate, and an interface module that connects the treating module with an external stepper. The index module, the treating module, and the interface module are sequentially arranged in a row. The treating module includes a coating block that performs a coating process on the substrate and a developing block that performs a developing process on the substrate. The coating block includes a coating chamber that forms a coating film on the substrate by supplying a coating solution, a first heat treatment chamber that performs a heat treatment process on the substrate, and a first transfer chamber having a transfer unit that transfers the substrate between the coating chamber and the first heat treatment chamber. The developing block includes a developing chamber that performs a developing process on the substrate by supplying a developing solution, a second heat treatment chamber that performs a heat treatment process on the substrate, a supercritical chamber that treats the substrate by supplying a supercritical fluid, and a second transfer chamber having a transfer unit that transfers the substrate W between the developing chamber, the second heat treatment chamber, and the supercritical chamber.

According to an embodiment, the apparatus may further include a controller that controls the transfer unit of the second transfer chamber, and the controller may control the transfer unit to sequentially transfer the substrate to the developing chamber and the supercritical chamber.

According to an embodiment, the controller may control the transfer unit to transfer the substrate having the developing solution remaining thereon from the developing chamber to the supercritical chamber.

According to an embodiment, the developing chamber may include a developing nozzle that supplies the developing solution and a cleaning nozzle that supplies a cleaning solution. The controller may control the transfer unit to transfer the substrate having the developing solution or the cleaning solution remaining thereon from the developing chamber to the supercritical chamber.

According to an embodiment, the developing chamber may include a plurality of developing chambers vertically stacked one above another. A dimension of the supercritical chamber in a vertical direction may be larger than a dimension of one developing chamber in the vertical direction and may be equal to or smaller than a dimension of two developing chambers stacked on each other in the vertical direction.

According to an embodiment, the developing chambers and the second heat treatment chamber in the developing block may be disposed on one side of the transfer chamber, and the supercritical chamber may be disposed on the one side and an opposite side of the transfer chamber.

According to an embodiment, the coating block may include a plurality of coating blocks and the developing block may include a plurality of developing blocks, in which the coating blocks and the developing blocks may be vertically stacked one above another.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
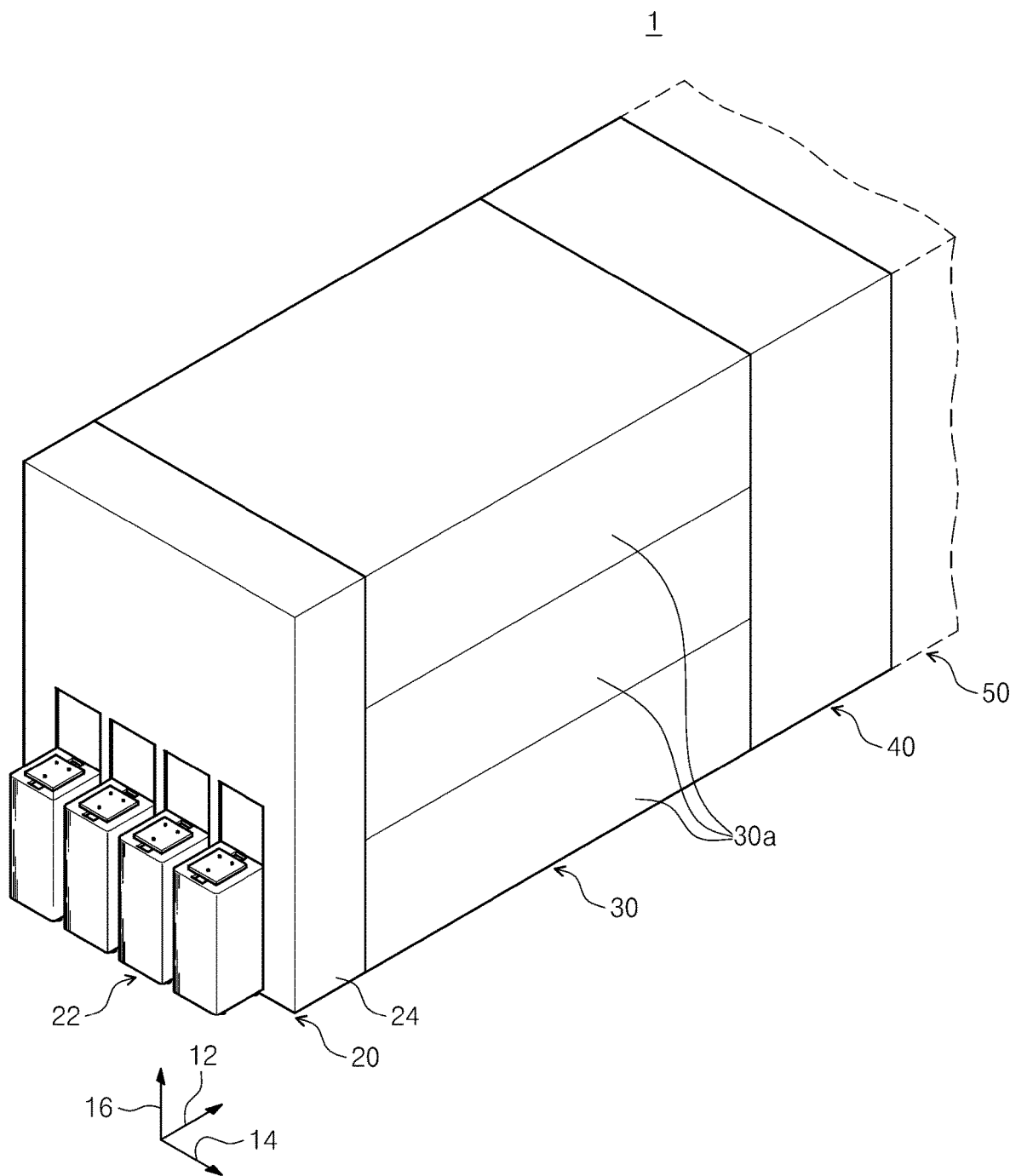
FIG. 1 is a schematic perspective view illustrating a substrate treating apparatus according to an embodiment of the inventive concept.

Hereinafter, embodiments of the inventive concept will be described in more detail with reference to the accompanying drawings. The inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. In the drawings, the dimensions of components are exaggerated and reduced for clarity of illustration.

Figure 2:
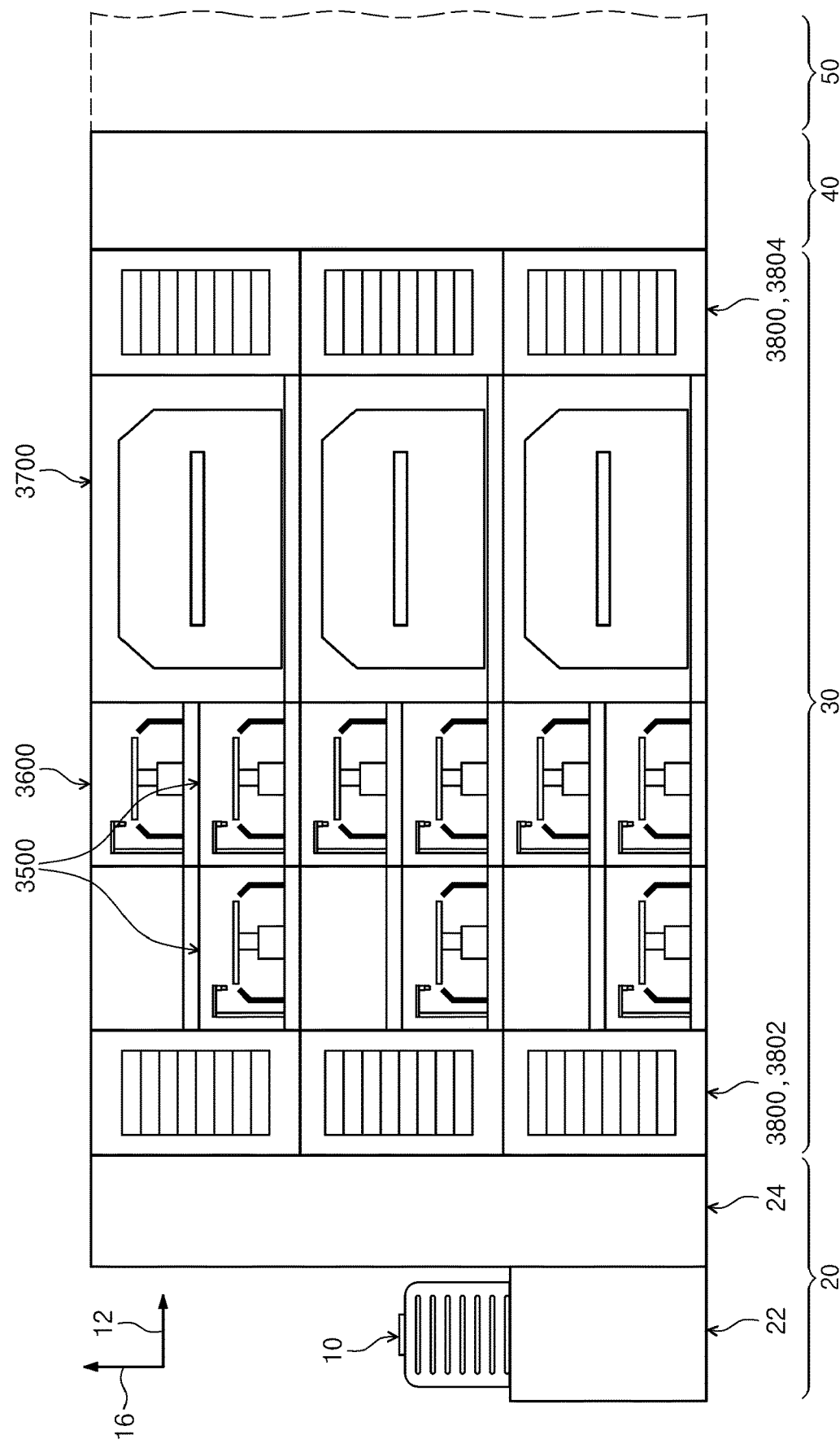
FIG. 2 is a sectional view of the substrate treating apparatus illustrating a treating block of FIG. 1.
Figure 3:
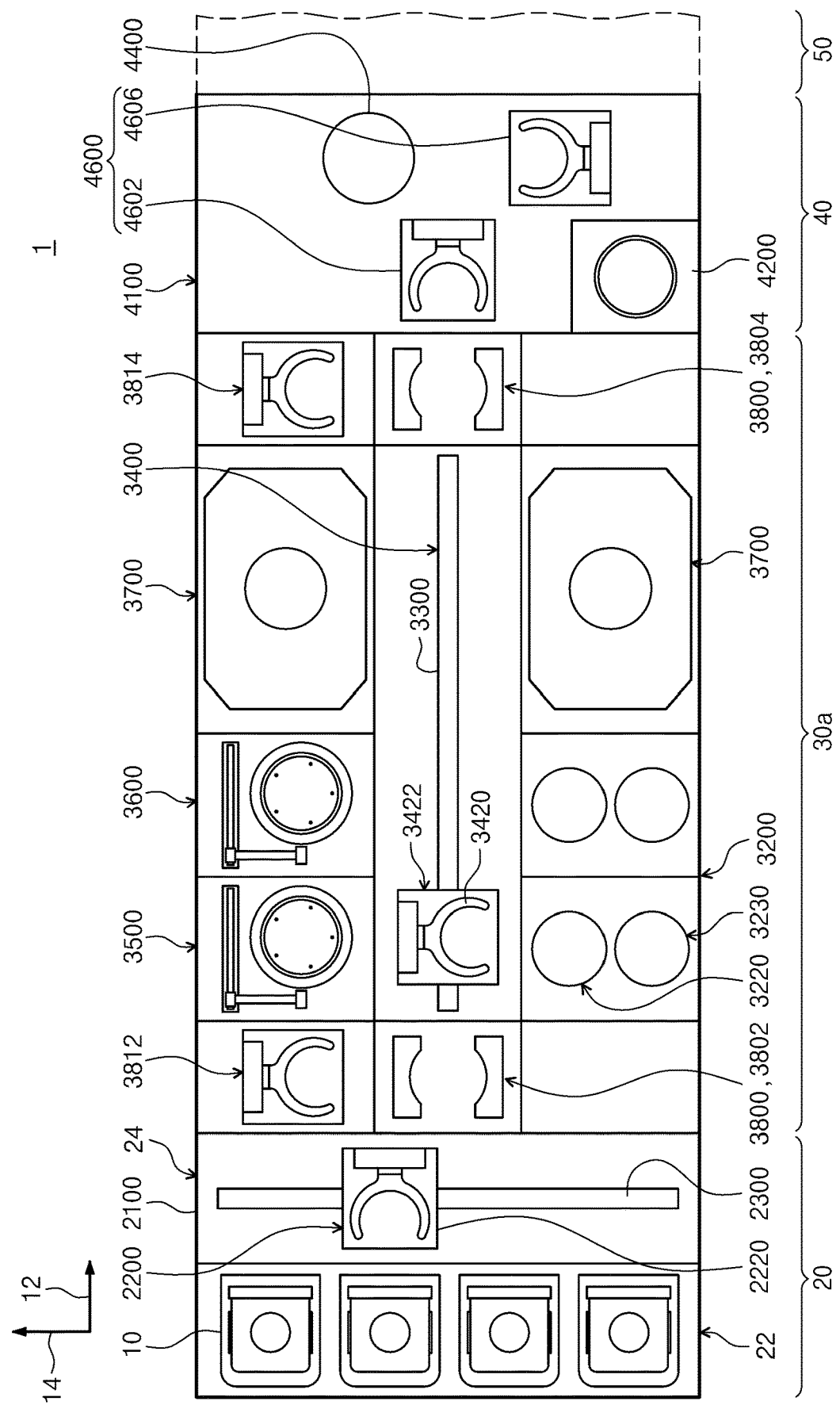
FIG. 3 is a plan view illustrating the substrate treating apparatus of FIG. 1.

FIG. 1 is a schematic perspective view illustrating a substrate treating apparatus according to an embodiment of the inventive concept. FIG. 2 is a sectional view of the substrate treating apparatus illustrating a treating block of FIG. 1. FIG. 3 is a plan view illustrating the substrate treating apparatus of FIG. 1.

Referring to FIGS. 1 to 3, the substrate treating apparatus 1 includes an index module 20, a treating module 30, and an interface module 40. According to an embodiment, the index module 20, the treating module 30, and the interface module 40 are sequentially arranged in a row. Hereinafter, the direction in which the index module 20, the treating module 30, and the interface module 40 are arranged is referred to as an X-axis direction 12, a direction perpendicular to the X-axis direction 12 when viewed from above is referred to as a Y-axis direction 14, and a direction perpendicular to both the X-axis direction 12 and the Y-axis direction 14 is referred to as a Z-axis direction 16.

The index module 20 transfers substrates W from carriers 10, in which the substrates W are received, to the treating module 30 and places the completely treated substrates W in the carriers 10. The lengthwise direction of the index module 20 is parallel to the Y-axis direction 14. The index module 20 includes load ports 22 and an index frame 24. The load ports 22 are located on the opposite side to the treating module 30 with respect to the index frame 24. The carriers 10 having the substrates W received therein are placed on the load ports 22. The load ports 22 may be arranged along the Y-axis direction 14.

Airtight carriers 10 such as front open unified pods (FOUPs) may be used as the carriers 10. The carriers 10 may be placed on the load ports 22 by a transfer means (not illustrated) such as an overhead transfer, an overhead conveyor, or an automatic guided vehicle, or by an operator.

An index robot 2200 is provided in the index frame 24. A guide rail 2300, the lengthwise direction of which is parallel to the Y-axis direction 14, is provided in the index frame 24, and the index robot 2200 is movable on the guide rail 2300. The index robot 2200 includes hands 2220 on which the substrates W are placed, and the hands 2220 are movable forward and backward, rotatable about an axis oriented in the Z-axis direction 16, and movable along the Z-axis direction 16.

According to an embodiment of the inventive concept, the treating module 30 may perform treating processes on the substrates W. For example, the treating module 30 may perform a coating process, a developing process, a heat treatment process, and a supercritical process on the substrates W.

The treating module 30 includes the treating block 30a. The treating block 30a may perform the treating processes on the substrates W. A plurality of treating blocks 30a may be provided. The treating blocks 30a may be stacked one above another. According to the embodiment of FIG. 3, three treating blocks 30a may be provided. According to an embodiment, the three treating blocks 30a may perform the same processes and may have the same structure.

Referring to FIGS. 2 and 3, each of the treating blocks 30a may include a heat treatment chamber 3200, a transfer chamber 3400, a coating chamber 3500, a developing chamber 3600, a supercritical chamber 3700, and a buffer chamber 3800.

The heat treatment chamber 3200 performs a heat treatment process on a substrate W. The heat treatment process may include a cooling process and a heating process. The coating chamber 3500 supplies a coating solution to the substrate W to form a coating film on the substrate W. The coating film may be a photoresist film or an anti-reflection film. The developing chamber 3600 supplies a developing solution to the substrate W to perform a developing process on the substrate W. For example, the developing chamber 3600 may include a developing nozzle for dispensing the developing solution and a cleaning nozzle for dispensing a cleaning solution. Accordingly, the developing chamber 3600 may supply the developing solution and/or the cleaning solution to the substrate W. The supercritical chamber 3700 supplies a supercritical fluid to the substrate W to treat the substrate W. For example, the supercritical chamber 3700 may perform a drying process on the substrate W by supplying the supercritical fluid to the substrate W.

The transfer chamber 3400 may transfer the substrate W between the heat treatment chamber 3200, the coating chamber 3500, the developing chamber 3600, and the supercritical chamber 3700 in the treating block 30a. The transfer chamber 3400 is arranged such that the lengthwise direction thereof is parallel to the X-axis direction 12. A transfer unit 3420 is provided in the transfer chamber 3400. The transfer unit 3420 may transfer the substrate W between the heat treatment chamber 3200, the coating chamber 3500, the developing chamber 3600, and the supercritical chamber 3700. According to an embodiment, the transfer unit 3420 has a hand A on which the substrate W is placed, and the hand A is movable forward and backward, rotatable about an axis oriented in the Z-axis direction 16, and movable along the Z-axis direction 16. A guide rail 3300, the lengthwise direction of which is parallel to the X-axis direction 12, is provided in the transfer chamber 3400, and the transfer unit 3420 is movable on the guide rail 3300.

Figure 4:
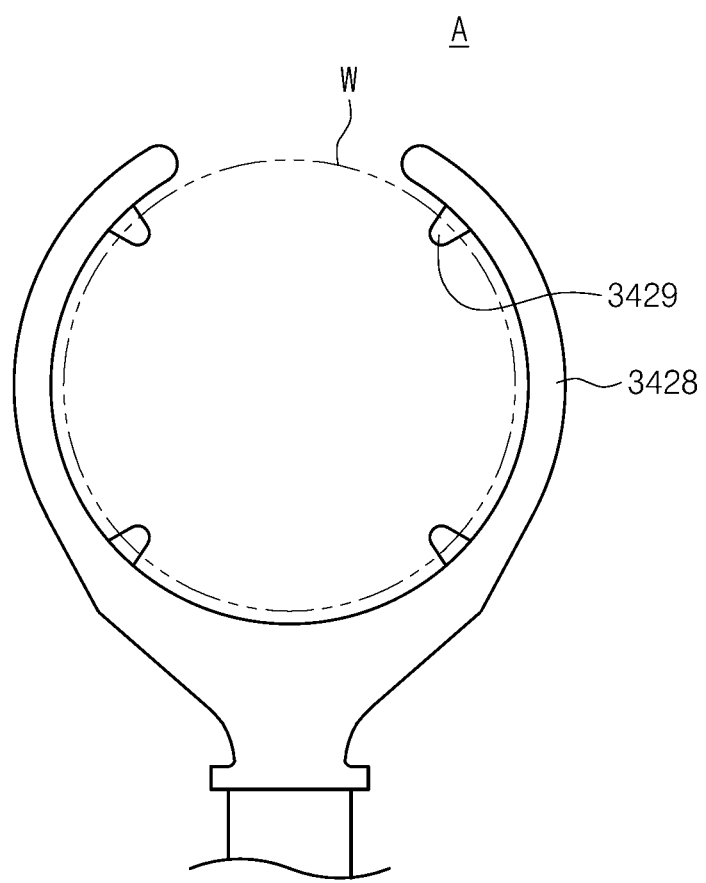
FIG. 4 is a view illustrating a hand of a transfer unit of FIG. 3.

FIG. 4 is a view illustrating the hand of the transfer unit of FIG. 3. Referring to FIG. 4, the hand A has a base 3428 and a support protrusion 3429. The base 3428 may have an annular ring shape with a partly curved circumference. The base 3428 has an inner diameter larger than the diameter of the substrate W. The support protrusion 3429 extends inward from the base 3428. A plurality of support protrusions 3429 may be provided. The support protrusions 3429 may support an edge region of the substrate W. According to an embodiment, four support protrusions 3429 may be provided at constant intervals.

Referring again to FIGS. 2 and 3, the coating chamber 3500 and the developing chamber 3600 may be disposed on one side of the transfer chamber 3400 in the treating block 30a.

In the treating block 30a, the number of developing chambers 3600 may be smaller than the number of coating chambers 3500. This is because the time during which the developing process is performed in the developing chamber 3600 is shorter than the time during which the coating process is performed in the coating chamber 3500. Accordingly, the number of developing chambers 3600 that do not perform the developing process may be reduced, and an excessive increase in footprint may be prevented.

According to an embodiment, a plurality of coating chambers 3500 may be provided in the treating block 30a. One of the plurality of coating chambers 3500 may be stacked on the developing chamber 3600. Another one of the plurality of coating chambers 3500 may not be stacked on the developing chamber 3600. For example, as illustrated in FIG. 2, two coating chambers 3500 and one developing chamber 3600 may be provided in one treating block 30a. One of the two coating chambers 3500 may be vertically stacked on the developing chamber 3600. Alternatively, the coating chamber 3500 may be disposed under the developing chamber 3600. Furthermore, the other coating chamber 3500 may not be stacked on the developing chamber 3600.

The supercritical chamber 3700 may be provided in the treating block 30a. The supercritical chamber 3700 may be provided adjacent to the developing chamber 3600. For example, the supercritical chamber 3700 may be provided adjacent to the developing chamber 3600 stacked on the coating chamber 3500. Because the developing chamber 3600 and the supercritical chamber 3700 are provided adjacent to each other, the substrate W subjected to the developing process in the developing chamber 3600 may be immediately transferred to the supercritical chamber 3700. Accordingly, the tact time taken to transfer the substrate W may be minimized. Furthermore, a controller (not illustrated) that controls the transfer unit 3420 may control the transfer unit 3420 to transfer the substrate W having the developing solution or the cleaning solution remaining thereon from the developing chamber 3600 to the supercritical chamber 3700. Accordingly, the substrate W may be prevented from being dried while being transferred.

The supercritical chamber 3700 may have a larger dimension in the vertical direction than the coating chambers 3500 or the developing chamber 3600. Furthermore, the dimension of the supercritical chamber 3700 in the vertical direction may be equal to or smaller than the sum of dimensions of one coating chamber 3500 and one developing chamber 3600 in the vertical direction. The supercritical chamber 3700 creates a high-pressure environment and supplies the supercritical fluid to the substrate W. Therefore, the supercritical chamber 3700 occupies a larger area in the apparatus than the coating chamber 3500 or the developing chamber 3600. According to an embodiment of the inventive concept, the dimension of one supercritical chamber 3700 in the vertical direction may have such a size that the coating chamber 3500 and the developing chamber 3600 are able to be disposed adjacent to the supercritical chamber 3700. That is, the coating chamber 3500 and the developing chamber 3600 may be disposed adjacent to the supercritical chamber 3700, thereby simplifying the transfer path of the substrate W in the treating block 30a and minimizing the tact time taken to transfer the substrate W.

The supercritical chamber 3700 may be disposed on one side and an opposite side of the transfer chamber 3400. The supercritical chambers 3700 disposed on the one side and the opposite side of the transfer chamber 3400 may face each other with respect to the transfer chamber 3400 when viewed from above.

In the related art, a spin dry method of drying a substrate while rotating the same is used to dry the substrate after a developing process. However, as the substrate has fine patterns formed thereon, the spin dry method in the related art causes a leaning phenomenon in which the patterns collapse or bend. In contrast, according to an embodiment of the inventive concept, the substrate W having the developing solution or the cleaning solution remaining thereon is transferred to the supercritical chamber 3700 immediately after the developing process is performed on the substrate W. The supercritical chamber 3700 supplies the supercritical fluid to the substrate W and dries the substrate W, thereby minimizing the leaning phenomenon mentioned above. Furthermore, because the substrate W is transferred in the state in which the developing solution or the cleaning solution remains on the substrate W, the problem that the substrate W is dried while being transferred and therefore the quality is degraded may be prevented.

A plurality of heat treatment chambers 3200 may be provided. The plurality of heat treatment chambers 3200 may be stacked one above another along the Z-axis direction 16. Furthermore, when viewed from above, the heat treatment chambers 3200 may be disposed on the opposite side of the transfer chamber 3400 to face the coating chambers 3500 and the developing chamber 3600 disposed on the one side of the transfer chamber 3400.

A plurality of buffer chambers 3800 may be provided. Some of the buffer chambers 3800 are disposed between the index module 20 and the transfer chamber 3400. Hereinafter, these buffer chambers are referred to as front buffers 3802. The front buffers 3802 are stacked one above another along the vertical direction. The other buffer chambers are disposed between the transfer chamber 3400 and the interface module 40. Hereinafter, these buffer chambers are referred to as rear buffers 3804. The rear buffers 3804 are stacked one above another along the vertical direction. The front buffers 3802 and the rear buffers 3804 each temporarily store a plurality of substrates W. The substrates W stored in the front buffers 3802 are extracted by the index robot 2200 and the transfer unit 3420. The substrates W stored in the rear buffers 3804 are extracted by the transfer unit 3420 and a first robot 4602.

The interface module 40 connects the treating module 30 with an external stepper 50. The interface module 40 has an interface frame 4100, an additional process chamber 4200, an interface buffer 4400, and a transfer member 4600.

The interface frame 4100 may have a fan filter unit at the top thereof, which forms a downward flow of air in the interface frame 4100. The additional process chamber 4200, the interface buffer 4400, and the transfer member 4600 are disposed in the interface frame 4100. The additional process chamber 4200 may perform a predetermined additional process before the substrate W treated in the treating block 30a is transferred to the stepper 50. Alternatively, the additional process chamber 4200 may perform a predetermined additional process before the substrate W treated in the stepper 50 is transferred to the treating block 30a. According to an embodiment, the additional process may be an edge exposing process of exposing the edge region of the substrate W to light, a top-side cleaning process of cleaning the top side of the substrate W, or a back-side cleaning process of cleaning the backside of the substrate W. A plurality of additional process chambers 4200 may be provided. The additional process chambers 4200 may be stacked one above another. The additional process chambers 4200 may all perform the same process. Alternatively, some of the additional process chambers 4200 may perform different processes.

The interface buffer 4400 provides a space in which the substrate W transferred between the treating blocks 30a, the additional process chambers 4200, and the stepper 50 temporarily stays. A plurality of interface buffers 4400 may be provided. The interface buffers 4400 may be stacked one above another.

According to an embodiment, the additional process chambers 4200 may be disposed on one side of an extension line oriented in the lengthwise direction of the transfer chamber 3400, and the interface buffers 4400 may be disposed on an opposite side of the extension line.

The transfer member 4600 transfers the substrate W between the treating block 30a, the additional process chambers 4200, and the stepper 50. The transfer member 4600 may be implemented with one or more robots. According to an embodiment, the transfer member 4600 has the first robot 4602 and a second robot 4606. The first robot 4602 may transfer the substrate W between the treating block 30a, the additional process chambers 4200, and the interface buffers 4400, and the second robot 4606 may transfer the substrate W between the interface buffers 4400 and the stepper 50.

The first robot 4602 and the second robot 4606 each include a hand on which the substrate W is placed, and the hand is movable forward and backward, rotatable about an axis parallel to the Z-axis direction 16, and movable along the Z-axis direction 16.

Figure 5:
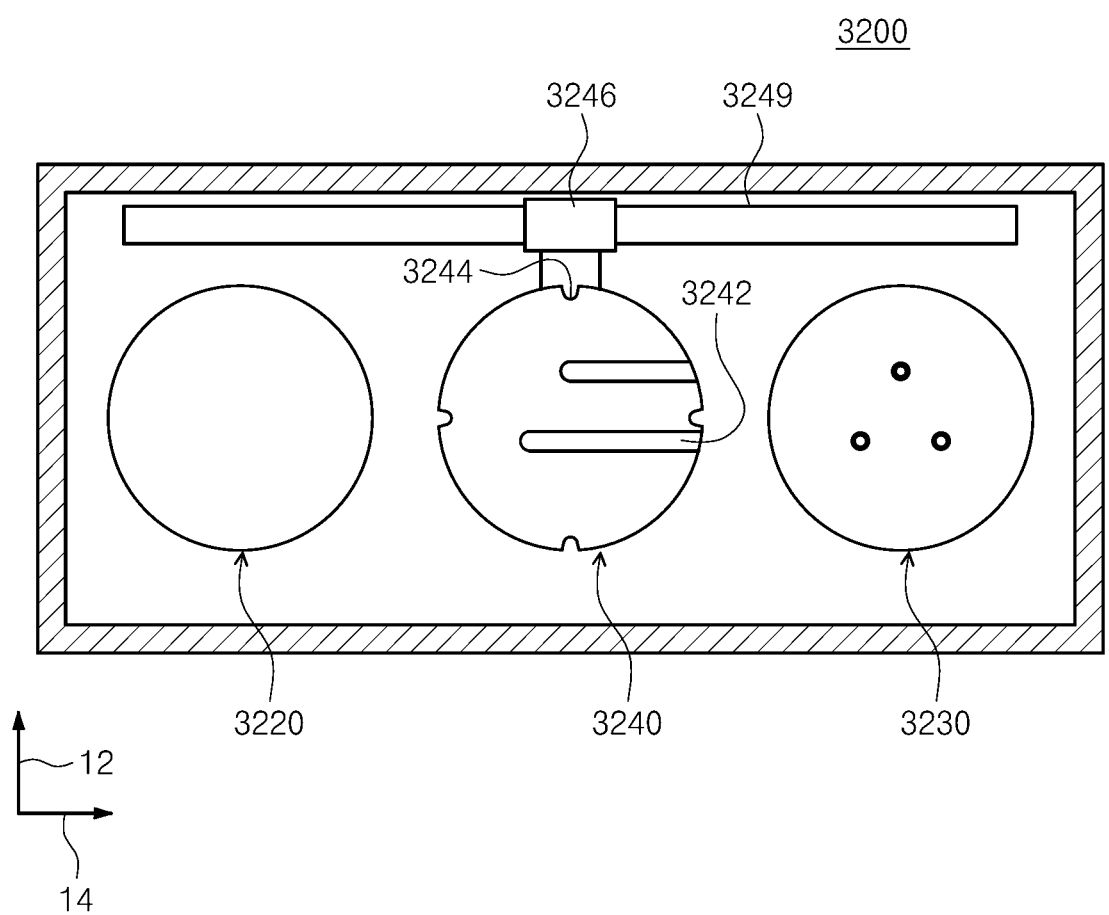
FIG. 5 is a schematic horizontal sectional view illustrating a heat treatment chamber of FIG. 3.
Figure 6:
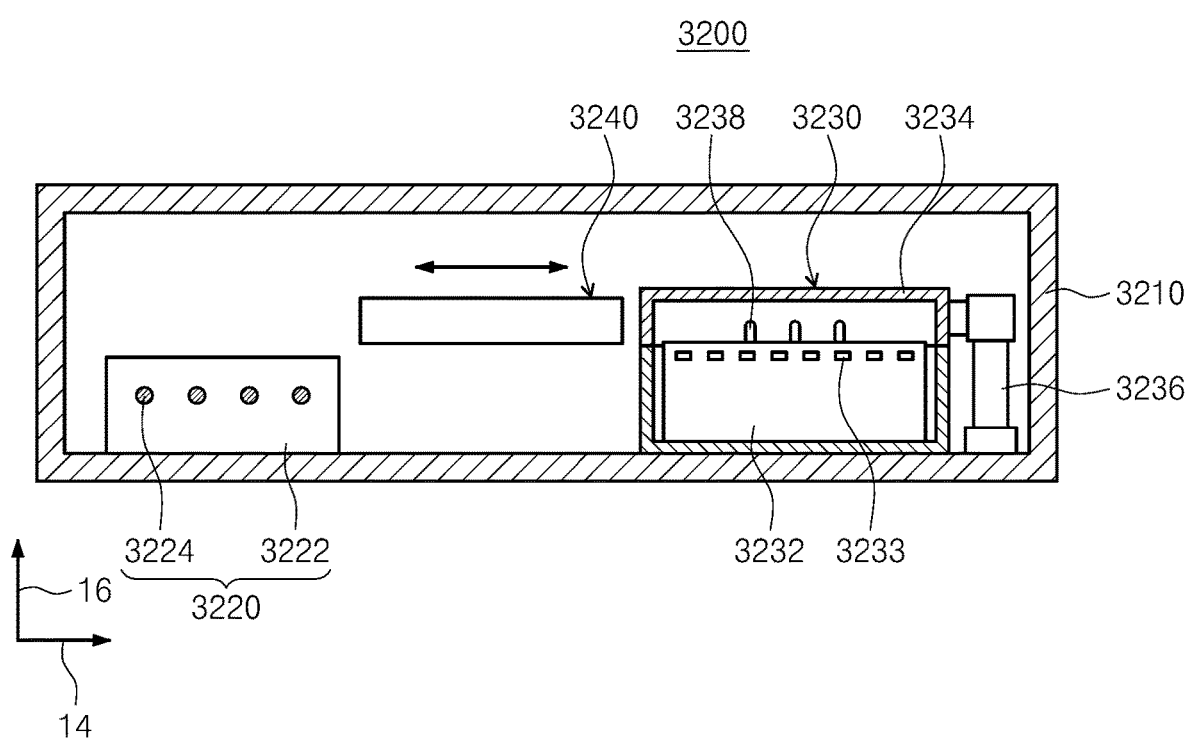
FIG. 6 is a vertical sectional view illustrating the heat treatment chamber of FIG. 5.

FIG. 5 is a schematic horizontal sectional view illustrating the heat treatment chamber of FIG. 3, and FIG. 6 is a vertical sectional view illustrating the heat treatment chamber of FIG. 5. Referring to FIGS. 5 and 6, the heat treatment chamber 3200 has a housing 3210, a cooling unit 3220, a heating unit 3230, and a transfer plate 3240.

The housing 3210 has a substantially rectangular parallelepiped shape. The housing 3210 has an entrance (not illustrated) formed in a sidewall thereof, through which the substrate W is loaded into or unloaded from the housing 3210. The entrance may remain open. Alternatively, a door (not illustrated) for opening or closing the entrance may be provided. The cooling unit 3220, the heating unit 3230, and the transfer plate 3240 are provided in the housing 3210. The cooling unit 3220 and the heating unit 3230 are provided side by side along the Y-axis direction 14. According to an embodiment, the cooling unit 3220 may be located closer to the transfer chamber 3400 than the heating unit 3230.

The cooling unit 3220 has a cooling plate 3222. The cooling plate 3222 may have a substantially circular shape when viewed from above. The cooling plate 3222 has a cooling member 3224 therein. According to an embodiment, the cooling member 3224 may be formed in the cooling plate 3222 and may serve as a fluid channel through which a cooling fluid flows.

The heating unit 3230 has a heating plate 3232, a cover 3234, and a heater 3233. The heating plate 323 has a substantially circular shape when viewed from above. The heating plate 3232 has a larger diameter than the substrate W. The heating plate 3232 is equipped with the heater 3233. The heater 3233 may be a resistance heating element to which electric current is applied. The heating plate 3232 has lift pins 3238 that are vertically movable along the Z-axis direction 16. The lift pins 3238 receive the substrate W from a transfer unit outside the heating unit 3230 and lay the substrate W down on the heating plate 3232, or raise the substrate W off the heating plate 3232 and transfer the substrate W to the transfer unit outside the heating unit 3230. According to an embodiment, three lift pins 3238 may be provided. The cover 3234 has a space therein, which is open at the bottom. The cover 3234 is located over the heating plate 3232 and vertically moved by an actuator 3236. When the cover 3234 is brought into contact with the heating plate 3232, the space surrounded by the cover 3234 and the heating plate 3232 serves as a heating space in which the substrate W is heated.

The transfer plate 3240 has a substantially circular plate shape and has a diameter corresponding to that of the substrate W. The transfer plate 3240 has notches 3244 formed at the edge thereof. The notches 3244 may have a shape corresponding to the protrusions 3429 formed on the hand A of the transfer unit 3420 described above. Furthermore, as many notches 3244 as the protrusions 3429, which are formed on the hand A, are formed in positions corresponding to the protrusions 3429. The substrate W is transferred between the hand A and the transfer plate 3240 when the vertical positions of the hand A and the transfer plate 3240 aligned with each other in the vertical direction are changed. The transfer plate 3240 is mounted on a guide rail 3249 and moved along the guide rail 3249 by an actuator 3246. A plurality of guide grooves 3242 in a slit shape are formed in the transfer plate 3240. The guide grooves 3242 extend inward from the edge of the transfer plate 3240. The lengthwise direction of the guide grooves 3242 is parallel to the Y-axis direction 14, and the guide grooves 3242 are spaced apart from each other along the X-axis direction 12. The guide grooves 3242 prevent the transfer plate 3240 and the lift pins 3238 from interfering with each other when the substrate W is transferred between the transfer plate 3240 and the heating unit 3230.

The substrate W is heated in the state in which the substrate W is directly placed on the heating plate 3232. The substrate W is cooled in the state in which the transfer plate 3240 on which the substrate W is placed is brought into contact with the cooling plate 3222. The transfer plate 3240 is formed of a material with a high heat transfer rate for efficient heat transfer between the cooling plate 3222 and the substrate W. According to an embodiment, the transfer plate 3240 may be formed of metal.

Heating units 3230 in some of the heat treatment chambers 3200 may improve adhesion of photoresist to the substrate W by supplying a gas while heating the substrate W. According to an embodiment, the gas may be a hexamethyldisilane gas.

Figure 7:
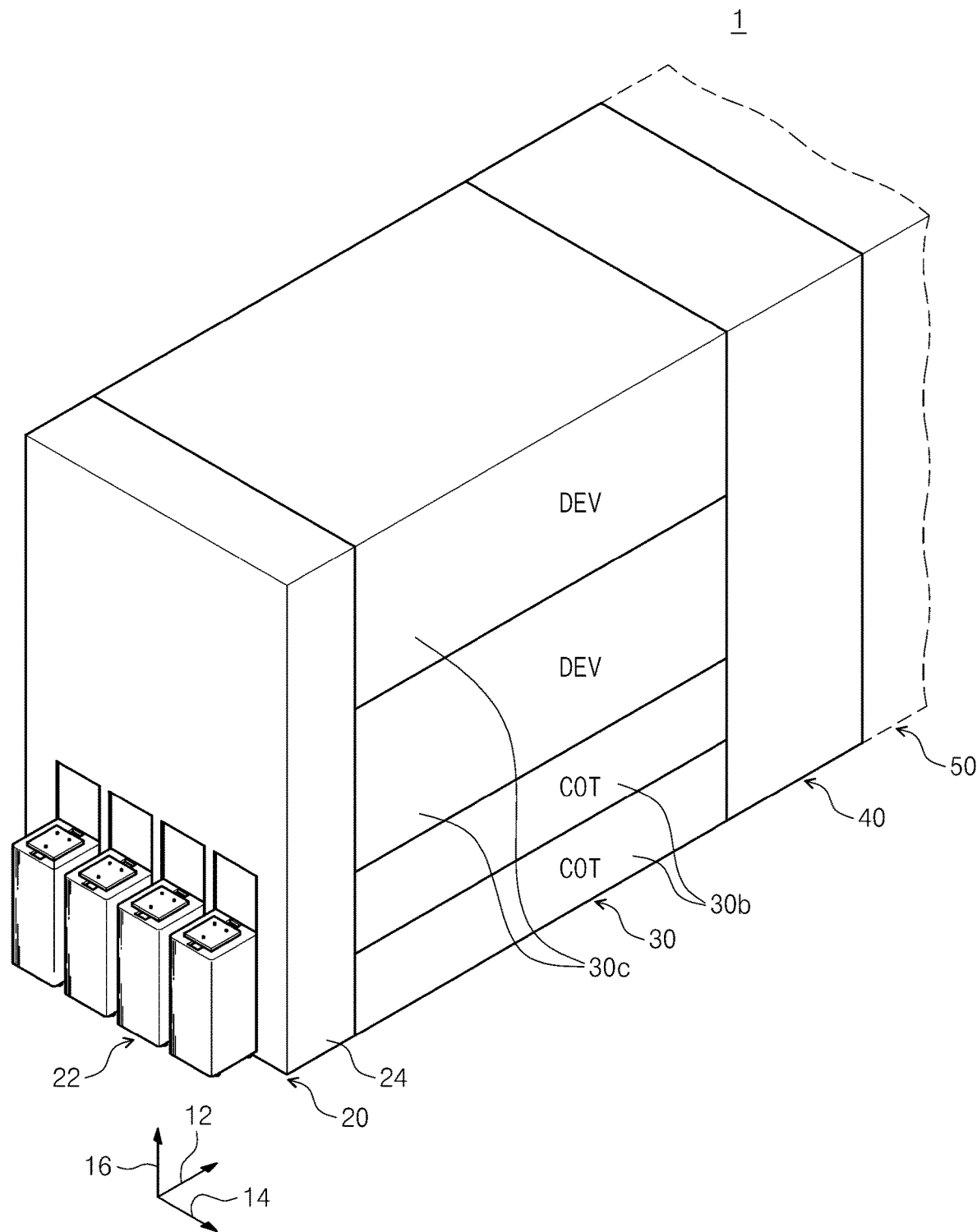
FIG. 7 is a schematic perspective view illustrating a substrate treating apparatus according to another embodiment of the inventive concept.
Figure 8:
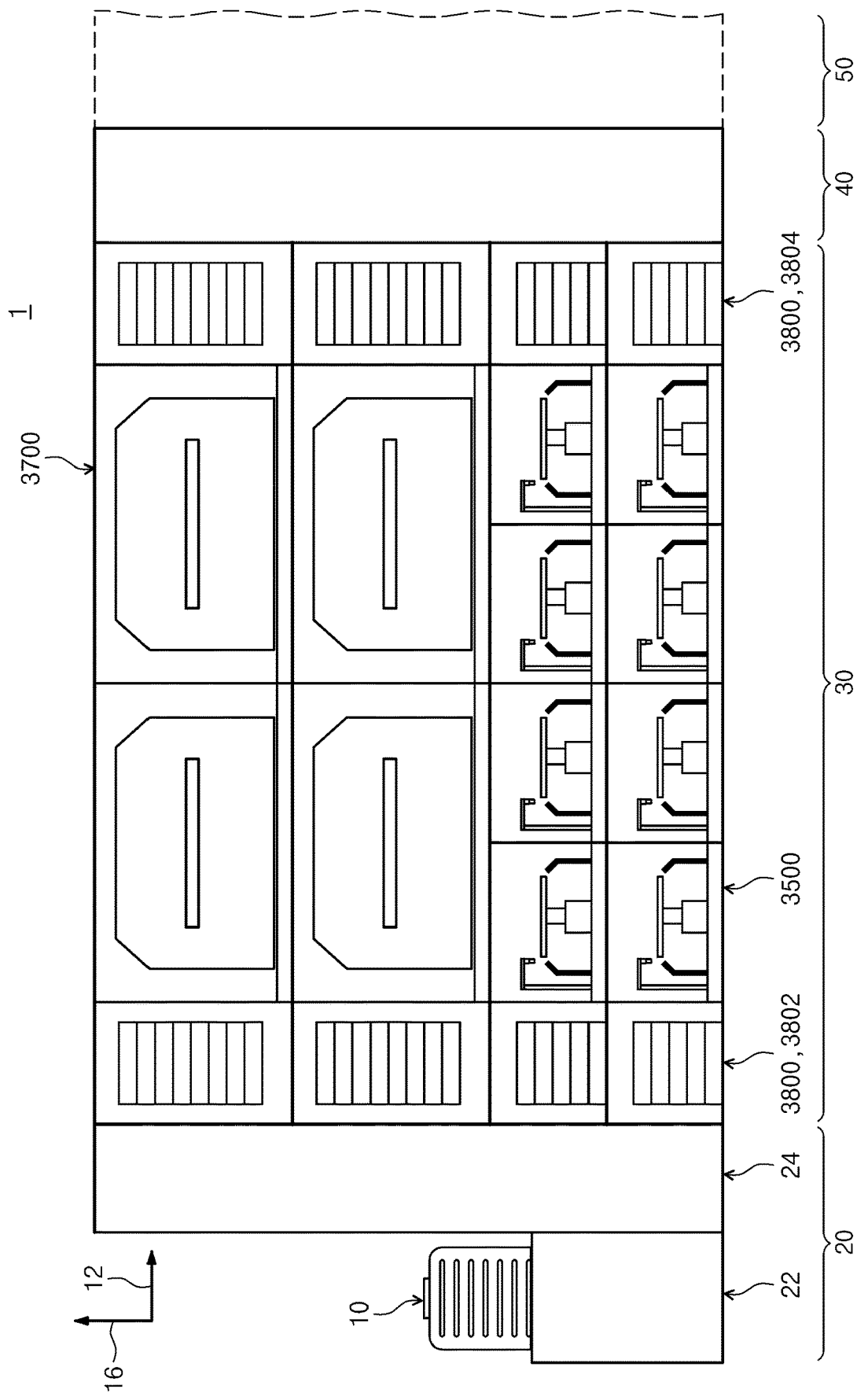
FIG. 8 is a sectional view of the substrate treating apparatus illustrating a coating block and a developing block of FIG. 7.
Figure 9:
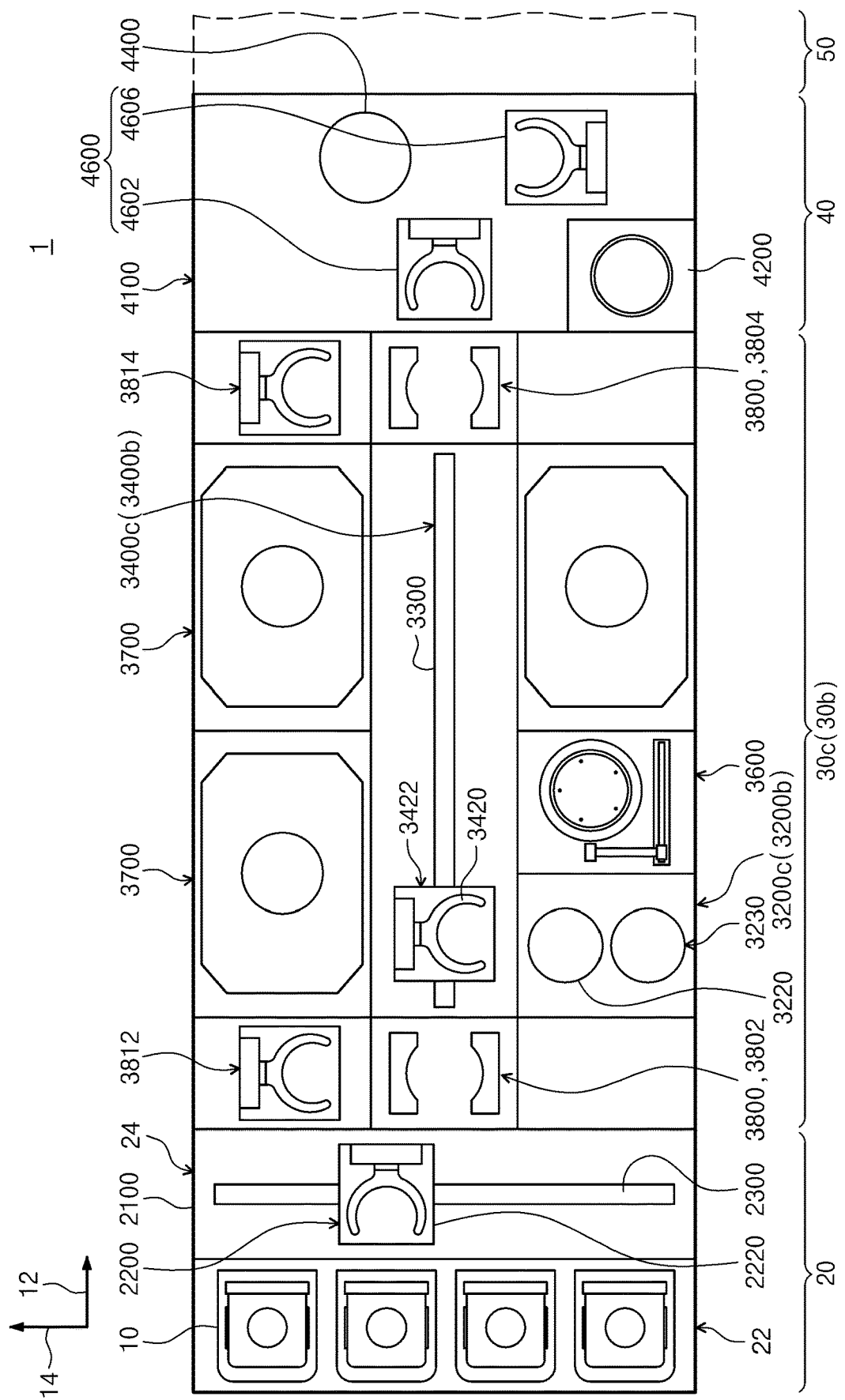
FIG. 9 is a plan view illustrating the substrate treating apparatus of FIG. 7.

FIG. 7 is a schematic perspective view illustrating a substrate treating apparatus according to another embodiment of the inventive concept. FIG. 8 is a sectional view of the substrate treating apparatus illustrating a coating block and a developing block of FIG. 7. FIG. 9 is a plan view illustrating the substrate treating apparatus of FIG. 7.

A treating module 30 may perform treating processes on a substrate W. For example, the treating module 30 may perform a coating process, a developing process, a heat treatment process, and a supercritical process on the substrate W.

The treating module 30 may have a coating block 30b and a developing block 30c. The coating block 30b performs the coating process on the substrate W, and the developing block 30c performs the developing process on the substrate W. A plurality of coating blocks 30b may be provided. The coating blocks 30b may be stacked one above another. A plurality of developing blocks 30c may be provided. The developing blocks 30c may be stacked one above another. According to the embodiment of FIG. 7, two coating blocks 30b and two developing blocks 30c are provided. The coating blocks 30b may be disposed under the developing blocks 30c. According to an embodiment, the two coating blocks 30b may perform the same process and may have the same structure. Furthermore, the two developing blocks 30c may perform the same process and may have the same structure.

Referring to FIGS. 8 and 9, the coating blocks 30b may each include a first heat treatment chamber 3200b, a first transfer chamber 3400b, and a coating chamber 3500.

A plurality of coating chambers 3500 may be provided. Some of the coating chambers 3500 may be stacked one above another. The coating chambers 3500 in the coating block 30b may be disposed on one side of the first transfer chamber 3400b when viewed from above. The coating chambers 3500 are arranged side by side along the X-axis direction 12.

A plurality of first heat treatment chambers 3200b may be provided. Some of the first heat treatment chambers 3200b may be stacked one above another. When viewed from above, the first heat treatment chambers 3200b may be disposed on an opposite side of the first transfer chamber 3400b to face the coating chambers 3500 disposed on the one side of the first transfer chamber 3400b.

Furthermore, the first transfer chamber 3400b may include a transfer unit 3420 that transfers the substrate W between the first heat treatment chambers 3200b and the coating chambers 3500.

The developing blocks 30c may each include a second heat treatment chamber 3200c, a second transfer chamber 3400c, a developing chamber 3600, and a supercritical chamber 3700.

A plurality of supercritical chambers 3700 may be provided. The supercritical chambers 3700 may be disposed on one side and an opposite side of the second transfer chamber 3400c when viewed from above. The supercritical chambers 3700 disposed on the one side of the second transfer chamber 3400c may be arranged side by side along the X-axis direction 12. The developing chamber 3600 and the second heat treatment chamber 3200c may be provided together with the supercritical chambers 3700 disposed on the opposite side of the second transfer chamber 3400c. The second heat treatment chamber 3200c, the developing chamber 3600, and the supercritical chambers 3700 may be arranged side by side along the X-axis direction 12.

A plurality of second heat treatment chambers 3200c and developing chambers 3600 may be provided on the opposite side of the second transfer chamber 3400c. The second heat treatment chambers 3200c and the developing chambers 3600 may be stacked one above another along the Z-axis direction 16.

The supercritical chambers 3700 disposed on the opposite side of the second transfer chamber 3400c may be provided adjacent to the developing chambers 3600. Because the developing chambers 3600 and the supercritical chambers 3700 are provided adjacent to each other, substrates W subjected to a developing process in the developing chambers 3600 may be immediately transferred to the supercritical chambers 3700. Accordingly, the tact time taken to transfer the substrates W may be minimized.

Furthermore, a controller (not illustrated) may control the transfer unit 3420 to transfer the substrates W having a developing solution or a cleaning solution remaining thereon from the developing chambers 3600 to the supercritical chambers 3700. Accordingly, the substrates W may be prevented from being dried while being transferred.

Furthermore, the supercritical chambers 3700 may each have a larger dimension in the vertical direction than one developing chamber 3600. Furthermore, the dimension of the supercritical chamber 3700 in the vertical direction may be equal to or smaller than the sum of dimensions of two developing chambers 3600, which are stacked on each other, in the vertical direction.

The above detailed description is based on the substrate treating apparatus according to the embodiment of the inventive concept. However, without being limited thereto, the inventive concept is applicable to all apparatuses for treating a substrate.

According to the embodiments, the inventive concept may efficiently perform a developing process.

According to the embodiments, the inventive concept may prevent a substrate from being dried when transferred from a developing chamber to a supercritical chamber.

According to the embodiments, the inventive concept may prevent a leaning phenomenon in which patterns collapse or bend.

According to the embodiments, the inventive concept may efficiently perform a coating process, a developing process, and a supercritical process.

According to the embodiments, the inventive concept may minimize tact time taken to transfer a substrate.

Effects of the inventive concept are not limited to the above-described effects, and any other effects not mentioned herein may be clearly understood from this specification and the accompanying drawings by those skilled in the art to which the inventive concept pertains.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
    a developing chamber configured to perform a developing process on the substrate by supplying a developing solution;
    a supercritical chamber configured to treat the substrate by supplying a supercritical fluid; and
    a transfer chamber having a transfer unit configured to transfer the substrate between the developing chamber and the supercritical chamber,
    wherein the developing chamber includes a developing nozzle configured to supply the developing solution and a cleaning nozzle configured to supply a cleaning solution,
    wherein the apparatus further comprises a controller configured to control the transfer unit, and
    wherein the controller controls the transfer unit to transfer the substrate having the developing solution or the cleaning solution remaining thereon from the developing chamber to the supercritical chamber.

2. The apparatus of claim 1, wherein the apparatus further comprises a heat treatment chamber configured to perform a heat treatment process on the substrate.

3. An apparatus for treating a substrate, the apparatus comprising:
    an index module including a carrier in which the substrate is received;
    a treating module configured to perform a process on the substrate; and
    an interface module configured to connect the treating module with an external stepper,
    wherein the index module, the treating module, and the interface module are sequentially arranged in a row,
    wherein the treating module includes a treating block configured to perform the process on the substrate, and
    wherein the treating block includes:
    a developing chamber configured to perform a developing process on the substrate by supplying a developing solution;
    a coating chamber configured to form a coating film on the substrate by supplying a coating solution;
    a heat treatment chamber configured to perform a heat treatment process on the substrate;
    a supercritical chamber configured to treat the substrate by supplying a supercritical fluid; and
    a transfer chamber having a transfer unit configured to transfer the substrate between the developing chamber, the coating chamber, the heat treatment chamber, and the supercritical chamber,
    wherein the developing chamber includes a developing nozzle configured to supply the developing solution and a cleaning nozzle configured to supply a cleaning solution,
    wherein the apparatus further comprises a controller configured to control the transfer unit, and
    wherein the controller controls the transfer unit to transfer the substrate having the developing solution or the cleaning solution remaining thereon from the developing chamber to the supercritical chamber.

4. The apparatus of claim 3, wherein the coating chamber and the developing chamber are vertically stacked on each other, and
    wherein a dimension of the supercritical chamber in a vertical direction is larger than a dimension of the coating chamber or the developing chamber in the vertical direction and is equal to or smaller than the sum of dimensions of the coating chamber and the developing chamber in the vertical direction.

5. The apparatus of claim 4, wherein the coating chamber and the developing chamber are disposed on one side of the transfer chamber, and
    wherein the heat treatment chamber is disposed on an opposite side of the transfer chamber.

6. The apparatus of claim 5, wherein the supercritical chamber is disposed on the one side and the opposite side of the transfer chamber.

7. The apparatus of claim 6, wherein the treating block includes a plurality of treating blocks vertically stacked one above another.

8. An apparatus for treating a substrate, the apparatus comprising:

an index module including a carrier in which the substrate is received;

a treating module configured to perform a process on the substrate;

an interface module configured to connect the treating module with an external stepper; and a controller configured to control the transfer unit of the second transfer chamber, wherein the controller controls the transfer unit to sequentially transfer the substrate to the developing chamber and the supercritical chamber, wherein the index module, the treating module, and the interface module are sequentially arranged in a row, wherein the treating module includes:
- a coating block configured to perform a coating process on the substrate; and
- a developing block configured to perform a developing process on the substrate, wherein the coating block includes:
  - a coating chamber configured to form a coating film on the substrate by supplying a coating solution;
  - a first heat treatment chamber configured to perform a heat treatment process on the substrate; and
  - a first transfer chamber having a transfer unit configured to transfer the substrate between the coating chamber and the first heat treatment chamber;

wherein the developing block includes:
- a developing chamber configured to perform a developing process on the substrate by supplying a developing solution;
- a second heat treatment chamber configured to perform a heat treatment process on the substrate;
- a supercritical chamber configured to treat the substrate by supplying a supercritical fluid; and
- a second transfer chamber having a transfer unit configured to transfer the substrate between the developing chamber, the second heat treatment chamber, and the supercritical chamber;

wherein the developing chamber includes a developing nozzle configured to supply the developing solution and a cleaning nozzle configured to supply a cleaning solution, and wherein the controller controls the transfer unit to transfer the substrate having the developing solution or the cleaning solution remaining thereon from the developing chamber to the supercritical chamber.

9. The apparatus of claim 8, wherein the developing chamber includes a plurality of developing chambers vertically stacked one above another, and wherein a dimension of the supercritical chamber in a vertical direction is larger than a dimension of one developing chamber in the vertical direction and is equal to or smaller than a dimension of two developing chambers stacked on each other in the vertical direction.

10. The apparatus of claim 9, wherein the developing chambers and the second heat treatment chamber in the developing block are disposed on one side of the transfer chamber, and the supercritical chamber is disposed on the one side and an opposite side of the transfer chamber.

11. The apparatus of claim 10, wherein the coating block includes a plurality of coating blocks and the developing block includes a plurality of developing blocks, the coating blocks and the developing blocks being vertically stacked one above another.

\* \* \* \* \*